(12) United States Patent
Krishnamoorthy et al.

(10) Patent No.: US 11,914,016 B2
(45) Date of Patent: Feb. 27, 2024

(54) OPTIMIZED K-SPACE PROFILE ORDERING FOR 3D RADIAL MR IMAGING

(71) Applicant: KONINKLIJKE PHILIPS N.V., Eindhoven (NL)

(72) Inventors: Guruprasad Krishnamoorthy, Rochester, NY (US); Gabriele Marianne Beck, Venlo (NL)

(73) Assignee: Koninklijke Philips N.V., Eindhoven (NL)

( * ) Notice: Subject to any disclaimer, the term of this patent is extended or adjusted under 35 U.S.C. 154(b) by 149 days.

(21) Appl. No.: 17/613,107

(22) PCT Filed: May 28, 2020

(86) PCT No.: PCT/EP2020/064781
§ 371 (c)(1),
(2) Date: Nov. 22, 2021

(87) PCT Pub. No.: WO2020/245018
PCT Pub. Date: Dec. 10, 2020

(65) Prior Publication Data
US 2022/0214416 A1    Jul. 7, 2022

(30) Foreign Application Priority Data
Jun. 4, 2019    (EP) .................................... 19178201

(51) Int. Cl.
*G01V 3/00*    (2006.01)
*G01R 33/48*    (2006.01)
(Continued)

(52) U.S. Cl.
CPC ..... *G01R 33/5608* (2013.01); *G01R 33/4818* (2013.01); *G01R 33/5607* (2013.01);
(Continued)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS

2006/0208730 A1\* 9/2006 Kozerke ............ G01R 33/5613
324/307
2009/0072826 A1\* 3/2009 Hargreaves ........ G01R 33/4828
324/309
(Continued)

FOREIGN PATENT DOCUMENTS

WO    WO-03100378 A2 \* 12/2003 ......... G01R 33/4824
WO    2013159044 A1    10/2013
(Continued)

OTHER PUBLICATIONS

Piccini et al "Spiral Phyllotaxis: The Natural Way to Construct a 3D Radial Trajectory in MRI" Magn. Reson. Med. 66 p. 1049-1056 (2011).

(Continued)

*Primary Examiner* — Walter L Lindsay, Jr.

(57) ABSTRACT

The invention relates to a method of MR imaging of an object (10). It is an object of the invention to enable MR imaging using radial acquisition with a reduced level of phase distortions and corresponding image artefacts. The method of the invention comprises the steps of: a) generating MR signals by subjecting the object to an imaging sequence comprising RF pulses and switched magnetic field gradients; b) acquiring the MR signals as radial k-space profiles, wherein pairs of spatially adjacent k-space profiles are acquired in opposite directions and wherein k-space profiles acquired in temporal proximity are close to each other in k-space; c) reconstructing an MR image from the acquired MR signals. Moreover, the invention relates to a (Continued)

MR device (1) and to a computer program for a MR device (1).

20 Claims, 3 Drawing Sheets

(51) Int. Cl.
  G01R 33/56 (2006.01)
  G01R 33/561 (2006.01)
  G01R 33/565 (2006.01)
(52) U.S. Cl.
  CPC ...... G01R 33/5611 (2013.01); G01R 33/5616 (2013.01); G01R 33/5618 (2013.01); G01R 33/56509 (2013.01)
(58) Field of Classification Search
  USPC .......................................................... 324/309
  See application file for complete search history.

(56) References Cited

U.S. PATENT DOCUMENTS

| | | | | |
|---|---|---|---|---|
| 2013/0170727 | A1* | 7/2013 | Kawamura | G06T 7/0012 382/131 |
| 2016/0274209 | A1* | 9/2016 | Dannels | G01R 33/4824 |
| 2016/0291106 | A1 | 10/2016 | Fuderer et al. | |
| 2017/0307714 | A1* | 10/2017 | Okell | G01R 33/56366 |
| 2017/0328970 | A1* | 11/2017 | Bi | A61B 5/055 |
| 2018/0284212 | A1 | 10/2018 | Tamada et al. | |

FOREIGN PATENT DOCUMENTS

| | | | | |
|---|---|---|---|---|
| WO | WO-2016066826 | A1 * | 5/2016 | ............. A61B 5/055 |
| WO | 2016202707 | A1 | 12/2016 | |
| WO | 2018184056 | A1 | 10/2018 | |

OTHER PUBLICATIONS

Pipe et al "A New Design and Rationale for 3D Orthogonally Oversampled k-space Trajectories" Magn. Reson. Med. 66 p. 1303-1311 (2011).

Wundrak et al "Golden Ratio Sparse MRI Using Tiny Golden Angles" Magn. Reson. Med 75 p. 2372-2378 (2016).

Wu et al "Anisotropic Field of View Support for Golden Angle Radial Imaging" Magn. Reson. Med 6 p. 229-236 (2016).

Hammernik et al "Learning a Variational Network for Reconstruction of Accelerated MRI Data" Magn. Reson. Med. 79 2055-2071 2018.

Song et al "k-Space Weighted Image Contrast (KWIC) for Contrast Manipulation in Projection Reconstruction MRI" Magn. Reson Med 44 p. 825-832 2000.

Grimm et al "Self-Gating Reconstructions of Motion and Perfusion for Free Breathing T1 Weighted DCEMRI of the Thorax using 3D Stack of Stars GRE Imaging" Proceedings of the 20th Scientific Meeting Int. Soc. for Magnetic Reson in Med. 2012.

International Search Report and Written Opinion from PCT/EP2020/064781 dated Dec. 10, 2020.

* cited by examiner

OPTIMIZED K-SPACE PROFILE ORDERING FOR 3D RADIAL MR IMAGING

CROSS REFERENCE TO RELATED APPLICATIONS

This application is a U.S. national phase application of International Application No. PCT/EP2020/064781 filed on May 28, 2020, which claims the benefit of EP Application Serial No. 19178201.0 filed on Jun. 4, 2019 and is incorporated herein by reference.

FIELD OF THE INVENTION

The invention relates to the field of magnetic resonance (MR) imaging. It concerns a method of MR imaging of an object placed in the examination volume of a MR device. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field $B_0$ whose direction at the same time defines an axis (normally the z-axis) of the co-ordinate system to which the measurement is related. The magnetic field $B_0$ produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the corresponding magnetic field $B_1$ of this RF pulse extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the magnetization is deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second and shorter time constant $T_2$ (spin-spin or transverse relaxation time). The transverse magnetization and its variation can be detected by means of receiving RF coils which are arranged and oriented within an examination volume of the MR device in such a manner that the variation of the magnetization is measured in the direction perpendicular to the z-axis. The decay of the transverse magnetization is accompanied by dephasing taking place after RF excitation caused by local magnetic field inhomogeneities facilitating a transition from an ordered state with the same signal phase to a state in which all phase angles are uniformly distributed. The dephasing can be compensated by means of a refocusing RF pulse (for example a 180° pulse). This produces an echo signal (spin echo) in the receiving coils.

In order to realize spatial resolution in the body, time-varying magnetic field gradients extending along the three main axes are superposed on the uniform magnetic field $B_0$, leading to a linear spatial dependency of the spin resonance frequency. The signal picked up in the receiving coils then contains components of different frequencies which can be associated with different locations in the body. The signal data obtained via the receiving coils correspond to the spatial frequency domain and are called k-space data. The k-space data usually include multiple lines acquired of different phase encoding. Each line is digitized by collecting a number of samples. A set of k-space data is converted to an MR image by means of Fourier transformation.

Different three-dimensional (3D) radial or spiral MR imaging techniques are known in the art.

In 3D radial MR imaging, a number of k-space profiles constituting projections through the imaged object at different orientations are acquired. Frequency encoding is applied simultaneously on all three coordinate axes with varying amplitudes to produce the required rotational pattern in k-space to fully cover a spherical volume in k-space according to the desired field of view (FOV) and image resolution. The radial k-space profiles are defined by polar and azimuthal rotation angles that are incremented independently during acquisition. As the 3D radial approach acquires radial projections with components along all three Cartesian coordinate axes ($k_x$, $k_y$, $k_z$) this technique is commonly referred to as Koosh ball imaging due to its similarity with the corresponding child's toy. In radial MR imaging, the acquired signal data are typically not reconstructed using filtered back projection but are 're-gridded' onto a conventional Cartesian k-space pattern and then reconstructed via direct Fourier transformation.

Different techniques have been proposed to arrange and order the radial profiles in k-space in order to achieve an efficient and uniform k-space coverage. One approach is known as "spiral phyllotaxis" (see Piccini et al. in Magn. Reson. Med., 66, 1049-1056, 2011). The proposed scheme is based on the spiral phyllotaxis which is known in botany as a particular arrangement of leaves on a stem. This pattern features a simple mathematical implementation and can be easily integrated into existing 3D radial acquisition frameworks. The spiral phyllotaxis pattern combines both an overall uniformity of the distribution of the k-space profiles and an intrinsic arrangement of the readouts that reduces eddy current effects. The spiral phyllotaxis pattern has proven as a robust solution for volumetric acquisitions where both radial undersampling and motion are involved.

A 3D spiral acquisition scheme is known under the acronym FLORET (Fermat looped, orthogonally encoded trajectories, see Pipe et al. in Magn. Res. Med., 66, 1303-1311, 2011). According to the FLORET approach, k-space profiles are acquired along 3D spiral trajectories. The trajectory set is based on a single Fermat spiral waveform, which is substantially undersampled in the center of k-space. Multiple trajectories are combined in a stacked cone configuration. The technique is very efficient in terms of gradient performance and uniform trajectory spacing. As a center-out trajectory, it provides a short minimum echo time and has a good k-space coverage.

In the known so-called stack-of-stars acquisition scheme (see, e.g., WO 2013/159044 A1), a number of spatially non-selective or slab-selective RF excitations is applied, each followed by the acquisition of one or more MR signals (e.g. gradient echo signals), wherein each MR signal represents a k-space profile. The MR signals are acquired as radial k-space profiles from a number of parallel planes in k-space. The planes are arranged at different positions along one coordinate axis in k-space. In this direction (e.g. the $k_z$-direction), standard Cartesian phase-encoding is performed, while the MR signals are acquired within each single plane along radial 'spokes' that are rotated around the center ($k_x=k_y=0$). This results in a cylindrical k-space coverage composed of stacked discs ('stack-of-stars'). Technically, this is realized by generating magnetic field gradients in the in-plane directions of the slices simultaneously and modulating their amplitudes.

Similarly, in the also known stack-of-spirals acquisition scheme, each non-selective or slab-selective RF excitation is followed by the acquisition of one or more MR signals that represent spiral k-space profiles. Like in the stack-of-stars method, the planes are also arranged at different positions along one coordinate axis in k-space, wherein standard Cartesian phase-encoding is performed in this direction, while the MR signals are acquired within each single plane along spiral trajectories having their origin in the k-space center ($k_x=k_y=0$).

The afore-described 3D radial and spiral acquisition schemes offer several promising advantages for clinical 3D and 4D MR imaging like high motion-robustness and benign aliasing artefacts. However, a drawback is that, e.g. due to inhomogeneities of the main magnetic field induced by the imaged object and eddy currents generated during acquisition, gradient channel delays etc., the prescribed radial or spiral k-space trajectories are often not the true trajectories along which the MR signals are acquired. Such deviations may lead to phase errors and artefacts in the reconstructed image.

In MR imaging using Cartesian sampling schemes, the k-space profiles are acquired in a rectilinear fashion and, hence, all k-space profiles accumulate phase errors in one particular direction which does often not lead to image artefacts. On the other hand, non-Cartesian k-space trajectories are significantly more susceptible to phase distortions. For example, in radial MR imaging, where k-space profiles are rotated around the centre of k-space, each k-space profile accumulates different phase errors depending on the rotation angle. These multi-directional phase errors lead to severe artefacts in the reconstructed image.

SUMMARY OF THE INVENTION

From the foregoing it is readily appreciated that there is a need for an improved MR imaging technique. It is consequently an object of the invention to enable MR imaging using radial acquisition with a reduced level of phase distortions and corresponding image artefacts.

In accordance with the invention, a method of MR imaging of an object placed in the examination volume of a MR device is disclosed. The method comprises the steps of:
a) generating MR signals by subjecting the object to an imaging sequence comprising RF pulses and switched magnetic field gradients;
b) acquiring the MR signals as radial or spiral k-space profiles to cover a three-dimensional volume in k-space, wherein pairs of spatially adjacent k-space profiles are acquired in opposite directions and wherein k-space profiles acquired in temporal proximity are close to each other in k-space; and
c) reconstructing an MR image from the acquired MR signals.

According to the invention, a two- or three-dimensional radial acquisition is performed. Therein, an ordering of the k-space profiles is applied in which the orientation of the k-space profiles is incremented such that (i) pairs of k-space profiles that are spatially adjacent are acquired in (nearly) opposite directions and (ii) as many as possible k-space profiles that are acquired in temporal proximity (e.g. successively acquired k-space profiles) are close to each other in k-space which means that they have a small spatial distance and a similar orientation in k-space. The invention is implemented as a volumetric radial multi-shot acquisition. An individual acquisition shot is associated with one radio frequency excitation and acquires k-space profiles from an individual k-space segment. Within one segment a first group of k-space profiles, for example (about) one half the number of k-space profiles for the segment at issue are acquired at equal first orientations for successive positions. Within that segment a second group, for example about the other half number of k-space profiles for that segment are acquired at equal second orientations, but (slightly) different from the orientations of the first group (half). The orientations of the k-space profiles are associated with a rotation angle in 3D k-space and each of the k-space profiles is associated with a position in k-space. For example, in a 3D stack-of-stars approach, the k-space profiles are in respective stacks at different longitudinal positions and the k-space profiles have respective angular orientations (in the cylindrical coordinate frame). Segments may be formed as groups of k-space profiles having equal first or second orientations for a number of different longitudinal stacked slices.

In this volumetric stack-of-stars radial type of k-space sampling, the acquisition of MR data is done in a multi-shot approach in which in each shot a k-space segment of k-space profiles is acquired. Near (in k-space) k-space profiles in groups along k-space spokes of equal orientation and different groups for one segment having a minimal angular increment. Neighbouring, in k-space, k-space profiles for one segment are acquired along opposite directions. This k-space sampling pattern appears to be rather insensitive for phase errors, notably as eddy current effects are minimised and cancel between k-space profiles of opposite directions.

By aligning k-space profiles that are acquired in opposite directions as close as possible to each other, notably within a segment, in k-space, the majority of phase errors can be avoided. The phase errors of the corresponding k-space profiles have opposed signs and can thus be cancelled out. Preferably, the acquired MR signal data are re-gridded onto a Cartesian k-space grid in the step of reconstructing the MR image such that a Fourier transform or another suitable conventional reconstruction algorithm can be applied. The phase errors cancel out in the re-gridding procedure such that the finally reconstructed MR image is free of phase error-induced artefacts. In this way, the invention achieves an intrinsic removal of phase errors that are caused, e.g., by $B_0$ inhomogeneities and/or eddy currents. Residual phase errors can be removed by using a conventional phase correction algorithm.

The imaging sequence employed by the method of the invention may be, for example, a turbo field echo (TFE) sequence or a balanced (turbo) field echo sequence or an echo planar imaging (EPI) or a turbo spin echo (TSE) sequence or GRASE sequence.

Preferably, a multi-echo acquisition can be applied, wherein the total set of k-space profiles required to reconstruct the MR image is divided into a number of "shots", i.e.

RF excitations followed by a number of refocusing gradients or refocusing RF pulses to generate a train of field or spin echoes in rapid succession, each echo corresponding to one k-space profile.

Preferably, the k-space profile ordering scheme of the invention is applied within each individual shot of the multi-echo imaging sequence. This means that one k-space segment is acquired within each shot using the k-space profile ordering of the invention. A different k-space segment is associated with each shot and the k-space segments associated with different shots are spatially distinct from each other. In this way, the requirement of the method of the invention that k-space profiles acquired in temporal proximity are close to each other in k-space is fulfilled. The k-space profiles acquired from a k-space segment are acquired within one shot of the imaging sequence and are, thus, acquired in temporal proximity. On the other hand, as the k-space profiles acquired in one shot cover a segment, that is, a closed partial volume in k-space, the k-space profiles comprised in one shot can be said to be close to each other, while the k-space profiles associated with different shots/segments are not.

In the multi-echo approach, the orientation of the k-space profiles is incremented between the shots (or from shot to shot in other words) to uniformly cover k-space. The orientation of the radial acquisitions is preferably incremented according to a golden angle scheme. In the golden angle-scheme, the orientation the k-space profiles is rotated each time by $\Delta\varphi=111.25°$, which corresponds to 180° multiplied by the golden ratio. Therefore, subsequently sampled k-space profiles always add complementary information while filling the largest gaps within the previously sampled k-space profiles. As a consequence, any sequential set of acquired profiles covers k-space approximately uniformly, which, e.g., enables reconstruction of temporal sub-frames and makes the method of the invention well-suited for dynamic (4D) imaging studies.

The term "golden angle" used herein also covers the known "tiny golden angle" (see Wundrak et. al., "Golden ratio sparse MRI using tiny golden angles", Magn. Reson. Med., 75, 2372-2378, 2016).

The method of the invention is particularly suited to be combined with fat suppression since the fat suppression effectivity is significantly improved by the method of the invention. Hence, the imaging sequence used according to the invention can comprise a fat suppression preparation sequence. This can be a preparation sequence as used in conventional MR imaging, such as an STIR (Short $T_1$ Inversion Recovery), SPIR (Spectral Pre-saturation with Inversion Recovery) or SPAIR (Spectral Attenuated Inversion Recovery) sequence.

SPAIR uses a spectrally selective adiabatic inversion pulse to invert the fat spins in the imaged volume. After the adiabatic pulse a large spoiler magnetic field gradient is applied in order to destroy any transverse magnetization. The inverted fat spins start relaxing back to the equilibrium state according to their $T_1$ relaxation rate. After a certain characteristic time, the longitudinal magnetization of the fat spins will be zero. At this time point, the excitation pulse of the actual acquisition module of the imaging sequence is applied. As the fat spins have zero longitudinal magnetization at this point, they will not contribute to the acquired MR signals. It can be considered to invert the k-space profile ordering of the invention after each application of a SPAIR preparation sequence. The intrinsic cancelling out of phase errors can be utilized to eliminate residual fat contributions in the reconstructed MR image.

In a preferred embodiment of the invention, the MR signals are acquired according to a Koosh ball, FLORET, stack-of-stars or stack-of-spirals scheme (see description, specific advantages and references above).

According to the invention, in combination with a 3D radial acquisition, the distribution of orientations of the k-space profiles can also be adapted to anisotropic field of views (see Wu et al. A1, "Anisotropic field-of-view support for golden angle radial imaging, Magn Reson Med., 76, 229-236, 2016), wherein the radial k-space profiles are not equidistantly distributed. Also the above-mentioned spiral phyllotaxis scheme may be utilized in accordance with the invention. Other methods to optimize the profile ordering may be combined with the invention, such as elliptical or CENTRA ordering (see WO 2016202707 A1) or the use of rotated stack-of-stars improving the acquisition speed (see Zhou et al., "Golden-ratio rotated stack-of-stars acquisition for improved volumetric MRI", Magn. Reson. Med. 2017). Also a half scan approach may be taken to speed up the acquisition.

The intrinsic phase error correction and variable k-space sampling density renders the method of the invention well-suited to be combined with compressed sensing (CS) or parallel imaging, such as SENSE or SMASH. Also deep learning methods can advantageously be used for reconstructing the MR image. A number of deep learning techniques have recently been applied successfully for MR image reconstruction in the context of CS (see, e.g., Hammernik et al. in Magn. Reson. Med., 79, 3055-3071, 2018).

In another preferred embodiment of the invention, the MR image is reconstructed using a k-space weighted image contrast (KWIC) filter (see Song et al., Magn. Reson. Med., 44, 825-832, 2000) to reconstruct the MR image of desired relaxation-time weighting.

K-space profiles acquired in the known PROPELLER imaging technique are also considered as radial k-space profiles within the meaning of the invention. In the PROPELLER concept, MR signals are acquired in k-space in N strips, each consisting of L parallel k-space profiles, corresponding to the L lowest frequency phase-encoding lines in a Cartesian-based k-space sampling scheme. Each strip, which is also referred to as k-space blade, is rotated in k-space by a rotation angle of, for example, 180°/N or the golden angle, so that the total set of MR signals spans a circle in k-space. In accordance with the invention, subsequent k-space blades may be acquired in opposite directions to achieve the intrinsic phase error correction of the invention.

In a further preferred embodiment, motion of the object occurring during the acquisition is derived from at least one k-space profile and the detected motion is corrected for in the step of reconstructing the MR image. Although their principal motion-robustness, the MR images obtained from 3D radial acquisitions may still be affected by motion as long as no additional measures for motion compensation are applied. It has been proposed to use a radial k-space profile as an intrinsic navigator for the detection of motion or breathing states (see, e.g., Grimm, R., et al. "Self-gating reconstructions of motion and perfusion for free-breathing $T_1$-weighted DCEMRI of the thorax using 3D stack-of-stars GRE imaging." Proceedings of the 20th scientific meeting, International Society for Magnetic Resonance in Medicine, 2012). Such approaches can advantageously be combined with the method of the invention to reduce motion-induced image artefacts.

The method of the invention described thus far can be carried out by means of a MR device including at least one main magnet coil for generating a uniform, steady magnetic field $B_0$ within an examination volume, a number of gradient coils for generating switched magnetic field gradients in different spatial directions within the examination volume, at least one body RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals. The method of the invention can be implemented by a corresponding programming of the reconstruction unit and/or the control unit of the MR device.

The method of the invention can be advantageously carried out on most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
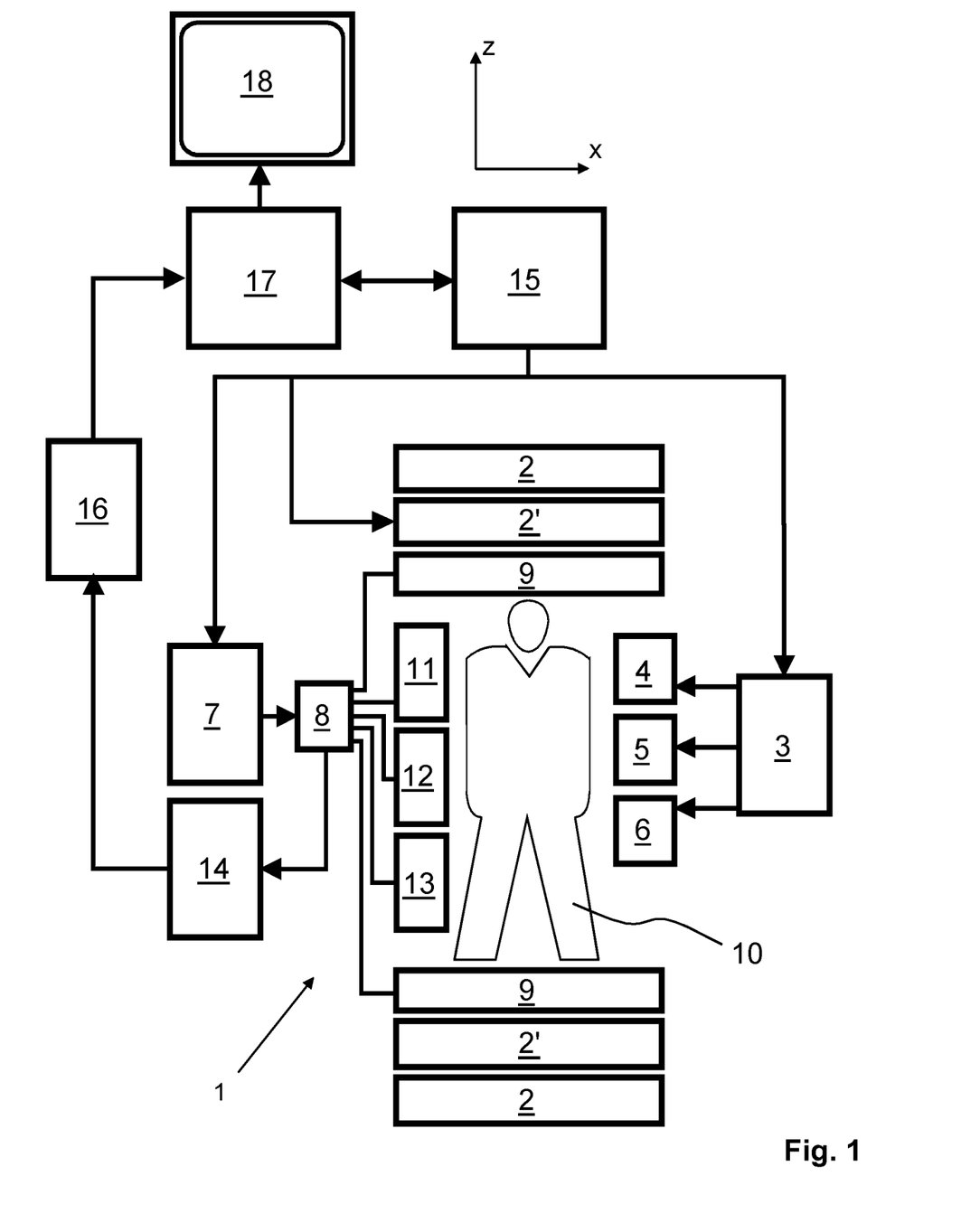
FIG. 1 shows a block diagram of an MR device for carrying out the method of the invention.

With reference to FIG. 1, a MR device 1 is shown as a block diagram. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient amplifier 3 applies current pulses or waveforms to selected ones of whole-body gradient coils 4, 5 and 6 along x, y and z-axes of the examination volume. A digital RF frequency transmitter 7 transmits RF pulses or pulse packets, via a send/receive switch 8, to a body RF coil 9 to transmit RF pulses into the examination volume. A typical MR imaging sequence is composed of a packet of RF pulse segments of short duration which, together with any applied magnetic field gradients, achieve a selected manipulation of nuclear magnetic resonance signals. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10 or for scan acceleration by means of parallel imaging, a set of local array RF coils 11, 12, 13 are placed contiguous to the region selected for imaging. The array coils 11, 12, 13 can be used to receive MR signals induced by body-coil RF transmissions.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via send/receive switch 8.

A host computer 15 controls the shimming coils 2' as well as the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data are reconstructed into an image representation by a reconstruction processor 17 which applies a Fourier transform or other appropriate reconstruction algorithms, such as SENSE or GRAPPA. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

The host computer 15 is programmed to execute the method of the invention described herein above and in the following.

With continuing reference to FIG. 1 and with further reference to FIGS. 2-5, embodiments of the imaging approach of the invention are explained.

Figure 2:
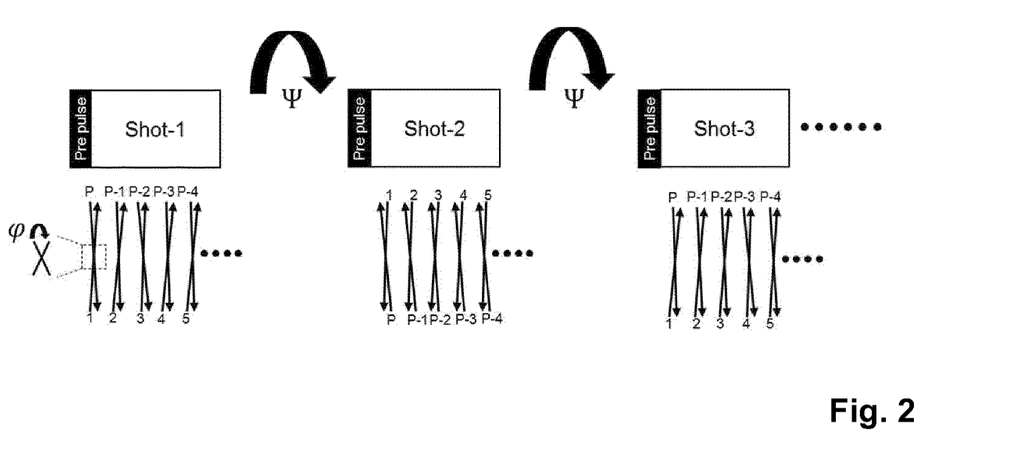
FIG. 2 schematically illustrates the acquisition scheme according to one embodiment of the invention.

The ordering of radial k-space profiles according to the invention is illustrated as an example in FIG. 2. In this example, the total number of k-space profiles (N) to be acquired is subdivided into a number of shots of which the first three (Shot-1, Shot-2, Shot-3) are shown. A number (1, 2, 3 . . . P) of radial k-space profiles is acquired in each shot illustrated in the figure by arrows below each block representing one shot. The number of k-space profiles per shot P is selected such that N=M×P. Each shot optionally comprises a preparation (sub-)sequence for fat suppression, e.g. a SPIR sequence. Within each shot, the numbers (1, 2, 3 . . . P) associated with the k-space profiles indicate the temporal acquisition order (e.g. the echo number). K-space profiles 1, 2, 3, 4, 5, . . . , P-4, P-3, P-2, P-1, P are acquired in such a way that the k-space profiles acquired in temporal proximity are close to each other in k-space. Each of the first and second halves of the k-space profiles of one shot have the same rotation angles respectively. The rotation angle is incremented after the first half of k-space profiles (1, 2, 3, 4, 5, . . . ) of each shot by a minimal angle φ, e.g. selected to fulfill the Nyquist criterion according to the field of view. Thereafter, the second half of k-space profiles . . . , P-4, P-3, P-2, P-1, P is acquired, from the same set of planes as the first half, but in the opposite direction and sequence. In this way, it is achieved that k-space profiles that are acquired close in time have identical or similar orientations in k-space to minimize readout gradient switching and, thus, eddy currents. Simultaneously, the k-space profiles are acquired such that the k-space profiles that are close in k-space (pairs [1, P], [2, P-1], [3, P-2], [4, P-3], [5, P-4] . . . ) are acquired in almost opposite directions to intrinsically cancel out the majority of phase errors and also to allow (optional) removal of residual phase errors in the reconstruction using a phase correction algorithm. The k-space profiles are rotated from shot to shot by the golden angle ψ to minimize motion related artefacts and to allow temporal filtering techniques like KWIC. The ordering scheme illustrated in FIG. 2 can be applied to various non-Cartesian k-space sampling schemes, like Koosh ball, FLORET, stack-of-stars and stack-of-spirals.

FIG. 3a shows an isometric perspective of k-space to further illustrate the afore-described ordering of k-space profiles of the invention for a 3D stack-of-stars acquisition. FIG. 3b shows a corresponding projection on the $k_x/k_y$-plane. In the depicted embodiment, the k-space profiles acquired in the first three consecutive shots of the imaging sequence are shown. Each shot is comprised of ten k-space profiles. The three sets of k-space profiles are acquired from distinct k-space segments associated with the respective shots. The temporal order of the k-space profiles is denoted as numbers at the starting point of each arrow representing a k-space profile and its respective acquisition direction. All phase-encoding steps along the coordinate axis $k_z$ are acquired sequentially before k-space profiles at different rotation angles are acquired. This ensures that periods of Cartesian sampling are kept short, which leads to high data consistency within the stack of planes and preserves the general motion-robustness of the radial sampling for the stack-of-stars approach. K-space profiles 1-5 are acquired with Cartesian phase encoding steps downwards in the $k_z$-direction before the rotation angle is minimally incremented and profiles 6-10 are acquired with Cartesian phase encoding steps upwards in the $k_z$-direction, i.e. from the same planes as profiles 1-5 but with (nearly) opposite acquisition direction. The rotation angle is incremented by the golden angle Ψ between consecutive shots as shown in FIG. 3b.

Figure 3:
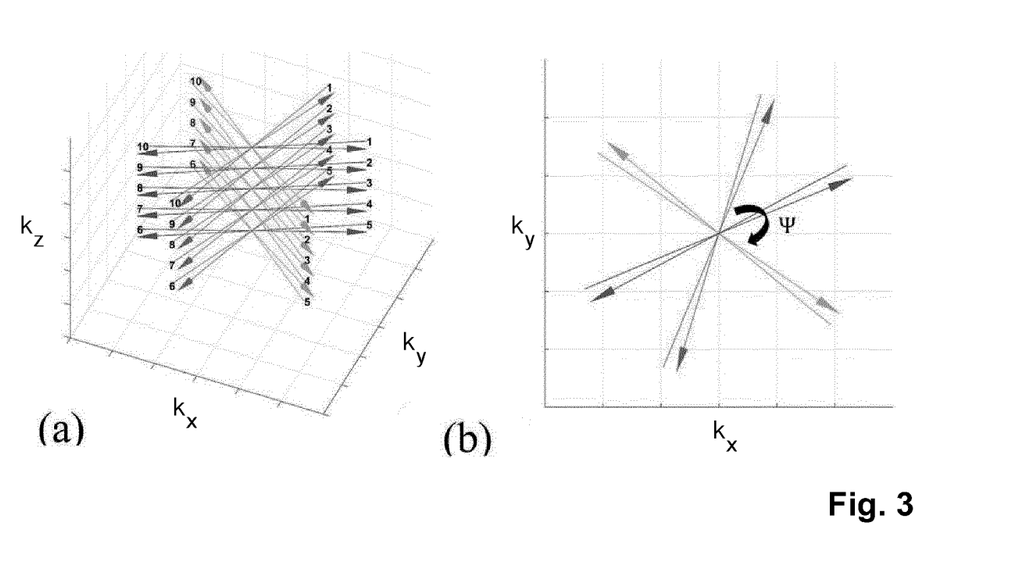
FIG. 3 shows a 3D stack-of-stars acquisition according to another embodiment of the invention.
Figure 4:
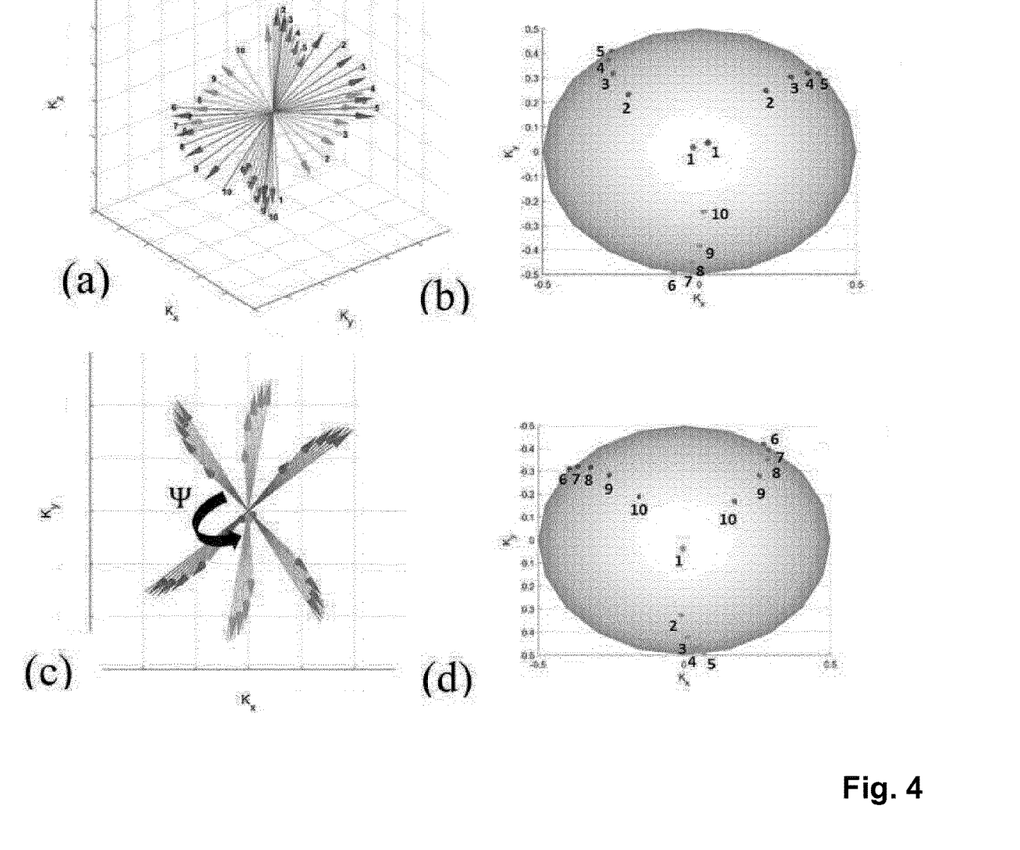
FIG. 4 illustrates a 3D Koosh ball acquisition using the k-space profile ordering of the invention.

FIG. 4 is an illustration of a Koosh ball acquisition based on the profile ordering scheme proposed by the invention. FIG. 4a shows an isometric perspective of k-space, FIGS. 3b and 3d show top and bottom views onto the surface of a spherical volume in k-space in which the k-space profiles are distributed. FIG. 3c shows a projection on the $k_x/k_y$-plane. All radial k-space profiles start on the surface of the sphere, go through the k-space origin and end on the surface of the sphere on its opposite side. Three groups of k-space profiles associated with three consecutive shots of the imaging sequence are shown. Again, the k-space profiles of each shot are acquired from a closed k-space segment associated with the respective shot. In the depicted embodiment, each shot is comprised of ten k-space profiles. The temporal order of the acquisition is denoted as numbers at the starting point of each arrow representing a k-space profile and its respective acquisition direction. Within each shot, the rotation angle is only minimally incremented in accordance with the Nyquist criterion. The trajectory of the starting or end points of the k-space profiles in each segment is chosen according to the spiral phyllotaxis scheme (see above). Like in the embodiment of FIG. 3, the acquisition direction is inverted after the first half of the k-space profiles of one shot, wherein the k-space profiles of the first and second halves are acquired at interleaved orientations such that gradient switching during acquisition can be minimized (to reduce eddy currents) and directly adjacent k-space profiles are acquired in (nearly) opposite directions. Between the consecutive shots, the orientation of the k-space profiles is rotated by the golden angle as shown in FIG. 4c.

Figure 5:
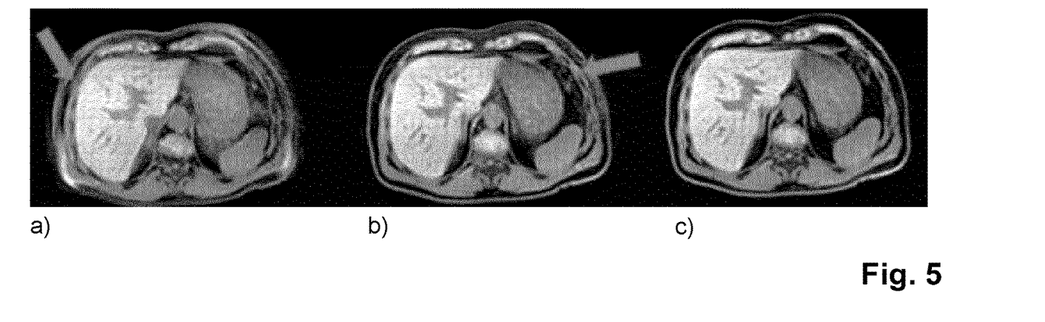
FIG. 5 shows abdominal MR images acquired conventionally and according to the method of the invention for a 3D Koosh ball acquisition.

FIG. 5 shows examples of MR images of the abdomen acquired using a 3D Koosh ball technique based on a conventional acquisition scheme (FIG. 5a) and using the profile ordering of the invention without (FIG. 5b) and with (FIG. 5c) additional phase correction. Blurring and phase errors from, for example $B_0$ inhomogeneity, eddy currents or gradient delays can clearly be seen in FIG. 5a (indicated by arrow). These artefacts are intrinsically separated and averaged out by the imaging technique of the invention. FIG. 5b clearly shows an improved fat suppression, increased contrast to noise and less blurring in the abdomen compared to FIG. 5a. However, some artefacts remain in FIG. 5b (indicated by arrow). Additional intrinsic phase correction (e.g. by a simple adjustment of the complex image values in different parts of the MR image to have a consistent phase) can completely remove phase effects with a further improvement in contrast to noise that is beneficial for a diagnosis and a better depiction of also smaller structures, particularly in difficult $B_0$ inhomogeneous pathology as typically found in abdominal imaging (FIG. 5c).

The invention claimed is:

1. A method of magnetic resonance (MR) imaging of an object positioned in an examination volume of a MR device, the method comprising:

a) generating MR signals by subjecting the object to a 3D radial imaging sequence comprising RF pulses and switched magnetic field gradients defining a field-of-view and including a number of shots of a multi-echo imaging sequence, each shot comprising an RF excitation pulse followed by a number of refocusing magnetic field gradients or refocusing RF pulses to generate a train of MR echo signals in rapid succession, wherein each MR echo signal corresponds to one k-space profile and wherein k-space profiles from one k-space segment are acquired during one shot of the multi-echo imaging sequence, with a different k-space segment being associated with each shot;

b) for an individual k-space segment acquiring the MR signals as radial k-space profiles for a first group of k-space profiles at a first rotation angle and subsequently for a second group of k-space profiles at a second rotation angle, wherein the second rotation angle is incremented relative to the first rotation angle by a minimal angle φ to fulfill Nyquist criterion according to the field-of-view, and wherein the k-space profiles of the first and second groups are acquired in opposite directions; and c) reconstructing an MR image from the acquired MR signals.

2. A magnetic resonance (MR) device including at least one main magnet coil for generating a uniform, steady magnetic field $B_0$ within an examination volume, a plurality of gradient coils for generating switched magnetic field gradients in different spatial directions within the examination volume, at least one RF coil for generating RF pulses within the examination volume and/or for receiving MR signals from an object positioned in the examination volume, a control unit for controlling temporal succession of RF pulses and switched magnetic field gradients, and a reconstruction unit for reconstructing MR images from the received MR signals, wherein the MR device is arranged to:
  a) generate MR signals by subjecting the object to a 3D radial imaging sequence comprising RF pulses and switched magnetic field gradients defining an field-of-view and including a number of shots of a multi-echo imaging sequence, each shot comprising an RF excitation pulse followed by a number of refocusing magnetic field gradients or refocusing RF pulses to generate a train of MR echo signals in rapid succession, wherein each MR echo signal corresponds to one k-space profile and wherein k-space profiles from one k-space segment are acquired during one shot of the multi-echo imaging sequence, with a different k-space segment being associated with each shot;
  b) for an individual k-space segment acquire the MR signals as radial k-space profiles for a first group of k-space profiles at a first rotation angle and subsequently for a second group of k-space profiles at a second rotation angle, wherein the second rotation angle is incremented relative to the first rotation angle by a minimal angle φ to fulfill Nyquist criterion according to the field-of-view, and wherein the k-space profiles of the first and second groups are acquired in opposite directions; and
  c) reconstruct an MR image from the acquired MR signals.

3. A non-transitory computer readable medium storing instructions that when executed by a computer of a magnetic resonance (MR) device, cause the computer to:
  a) generate MR signals by subjecting an object to a 3D radial imaging sequence comprising RF pulses and switched magnetic field gradients defining an field-of-view and including a number of shots of a multi-echo imaging sequence, each shot comprising an RF excitation pulse followed by a number of refocusing magnetic field gradients or refocusing RF pulses to generate a train of MR echo signals in rapid succession, wherein each MR echo signal corresponds to one k-space profile and wherein k-space profiles from one k-space segment are acquired during one shot of the multi-echo imaging sequence, with a different k-space segment being associated with each shot;
  b) for an individual k-space segment, acquire the MR signals as radial k-space profiles for a first group of k-space profiles at a first rotation angle and for a second group of k-space profiles at a second rotation angle, wherein the second rotation angle is incremented relative to the first rotation angle by a minimal angle φ to fulfill Nyquist criterion according to the field-of-view, and wherein the k-space profiles of the first and second groups are acquired in opposite directions; and
  c) reconstruct an MR image from the acquired MR signals.

4. The method of claim 1, wherein pairs of spatially adjacent k-space profiles are acquired in opposite directions and wherein k-space profiles acquired in temporal proximity are close to each other in k-space.

5. The method of claim 4, wherein spatially adjacent k-space profiles of one k-space segment are acquired in opposite directions.

6. The method of claim 1, wherein an orientation of the k-space profiles is incremented from shot to shot according to a golden angle scheme to uniformly cover k-space.

7. The method of claim 1, wherein the MR signals are acquired according to a Koosh ball scheme, a spiral phyllotaxis scheme, a Floret spiral scheme, a stack-of-stars scheme or a stack-of-spirals scheme.

8. The method of claim 1, wherein the multi-echo imaging sequence encompasses a fat suppression preparation sequence.

9. The method of claim 8, wherein an acquisition order of the k-space profiles is reversed after each instance of the fat suppression preparation sequence.

10. The method of claim 1, wherein spatially adjacent k-space profiles of a pair that are acquired in opposite directions differ minimally in terms of an orientation.

11. The method of claim 1, wherein the acquired MR signal data are re-gridded onto a Cartesian k-space grid in the step of reconstructing the MR image.

12. The method of claim 1, wherein the step of reconstructing the MR image involves a phase correction of the MR signal data.

13. The method of claim 1, wherein motion of the object occurring during acquisition is derived from at least one k-space profile and the motion is corrected for in the step of reconstructing the MR image.

14. The method of claim 1, wherein the MR image is reconstructed using non-cartesian SENSE or compressed sensing or a deep learning method.

15. The method of claim 1, wherein the multi-echo imaging sequence is a turbo field echo (TFE) or a balanced (turbo) field echo sequence or an echo planar imaging (EPI) sequence or a turbo spin echo (TSE) sequence or a GRASE sequence.

16. The method of claim 1, wherein the first group of k-space profiles comprises a first half of k-space profiles and the second group of k-space profiles comprises a second half to eh k-space profiles.

17. The method of claim 16, wherein the second half of the k-space profiles is acquired from a same set of planes as the first half of the k-space profiles, but in the opposite direction and an opposite sequence.

18. The non-transitory computer readable medium of claim 3, wherein pairs of spatially adjacent k-space profiles are acquired in opposite directions and wherein k-space profiles acquired in temporal proximity are close to each other in k-space.

19. The non-transitory computer readable medium of claim 18, wherein spatially adjacent k-space profiles of one k-space segment are acquired in opposite directions.

20. The non-transitory computer readable medium of claim 3, wherein an acquisition order of the k-space profiles is reversed when acquiring the MR signals for the second group than when acquiring the MR signals for the first group.

* * * * *